US010423072B2

(12) United States Patent
Xie et al.

(10) Patent No.: US 10,423,072 B2
(45) Date of Patent: Sep. 24, 2019

(54) EXPOSURE APPARATUS AND METHOD

(71) Applicant: SHANGHAI MICRO ELECTRONICS EQUIPMENT (GROUP) CO., LTD., Shanghai (CN)

(72) Inventors: Renbiao Xie, Shanghai (CN); Zhiyong Yang, Shanghai (CN); Angli Bai, Shanghai (CN); Jian Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/744,577

(22) PCT Filed: Jul. 13, 2016

(86) PCT No.: PCT/CN2016/089881
§ 371 (c)(1),
(2) Date: Jan. 12, 2018

(87) PCT Pub. No.: WO2017/008740
PCT Pub. Date: Jan. 19, 2017

(65) Prior Publication Data
US 2018/0203358 A1 Jul. 19, 2018

(30) Foreign Application Priority Data
Jul. 15, 2015 (CN) .......................... 2015 1 0416093

(51) Int. Cl.
G03F 7/20 (2006.01)
G02B 27/09 (2006.01)
(Continued)

(52) U.S. Cl.
CPC .......... *G03F 7/2008* (2013.01); *G02B 27/09* (2013.01); *G03F 7/2022* (2013.01);
(Continued)

(58) Field of Classification Search
CPC ........ G02B 2006/0098; G02B 27/0994; G03F 7/20; G03F 7/2008; G03F 7/70075;
(Continued)

(56) References Cited

U.S. PATENT DOCUMENTS 5,059,013 A * 10/1991 Jain ..................... G02B 27/0025
359/503
5,473,408 A * 12/1995 Hoffman ................ G02B 27/09
355/53

(Continued)

FOREIGN PATENT DOCUMENTS

CN 1782885 A 6/2006
CN 103296154 A 9/2013
(Continued)

*Primary Examiner* — Colin W Kreutzer
(74) *Attorney, Agent, or Firm* — Muncy, Geissler, Olds & Lowe, P.C.

(57) ABSTRACT

An exposure apparatus includes an exposure unit for exposing a wafer. The exposure unit includes an illumination system and masks. The illumination system includes a light-homogenizing unit. The light-homogenizing unit includes a light-homogenizing quartz rod having a regular hexagonal cross section. Each of the masks has a regular hexagonal shape matching with the cross section of the light-homogenizing quartz rod. A field of exposure resulting from this arrangement is less affected by objective field of view distortion and allows a higher useful depth of focus (UDoF) when compared to other fields of exposure of the same size. In addition, with the same projection objective DoF, a greater field of exposure can be obtained.

12 Claims, 7 Drawing Sheets

(51) Int. Cl.
*H01L 33/00* (2010.01)
*H01L 21/027* (2006.01)
*H01L 21/67* (2006.01)
*H01L 21/68* (2006.01)

(52) U.S. Cl.
CPC ........ *G03F 7/70075* (2013.01); *H01L 21/027* (2013.01); *H01L 21/67069* (2013.01); *H01L 21/682* (2013.01); *H01L 33/00* (2013.01)

(58) Field of Classification Search
CPC ............ H01L 21/027; H01L 21/67069; H01L 21/682; H01L 33/00
USPC .............................. 355/67, 71; 385/133, 146
See application file for complete search history.

(56) References Cited

U.S. PATENT DOCUMENTS

| | | | |
|---|---|---|---|
| 2010/0194015 A1* | 8/2010 | Vekstein ............. | H01L 21/6875 269/289 R |
| 2012/0212724 A1* | 8/2012 | Osaka .................. | G03F 7/7005 355/70 |
| 2014/0102643 A1 | 4/2014 | Porneala et al. | |
| 2017/0031245 A1* | 2/2017 | Nagahara .................. | G03F 7/20 |
| 2017/0219935 A1* | 8/2017 | Chen ..................... | H01L 21/027 |

FOREIGN PATENT DOCUMENTS

| | | | | |
|---|---|---|---|---|
| CN | 103676494 A | | 3/2014 | |
| JP | 2006186302 A | * | 7/2006 | |
| TW | 201108300 A | | 3/2011 | |
| WO | WO-2016045432 A1 | * | 3/2016 | ........... H01L 21/027 |

* cited by examiner

EXPOSURE APPARATUS AND METHOD

TECHNICAL FIELD

The present invention relates to photolithographic tools and, in particular, to an exposure apparatus and method.

BACKGROUND

A photolithographic tool is a machine for applying a pattern onto a substrate, in particular a desired portion thereof. Such machines can be used, for example, in the fabrication of integrated circuits (ICs). In such cases, it could be considered that a pattern on a mask or reticle is used to form a pattern for a single IC layer. This pattern can be imaged onto a target site (e.g. including one or more pins) of a substrate (e.g., a silicon substrate). In particular, in the field of light-emitting diode (LED) manufacturing, a pattern of dense holes is first imaged onto a patterned sapphire substrate.

Compared with stripes, the imaging of dense holes or circular pillars is much more difficult and tends to suffer from a much reduced depth of focus (DoF). Therefore, the photolithographic process is imposed with very high requirements on focal plane control. On the other hand, in contrast to silicon wafers, patterned sapphire substrates are hard in nature and tend to have significant warpage, which contribute to further reductions in the useful DoF (UDoF). With an insufficient UDoF, defocus arising from errors in the focal plane control by the photolithographic system may lead to a degree of inhomogeneity of the pattern image on the substrate that is beyond a tolerable range, which is manifested as a macro effect that portions of the pattern image on the substrate have varying degree of brightness even under the same lighting conditions, i.e., a phenomenon that "inconsistency" or "color differences" can be perceived with the naked eye. As the naked eye is very sensitive to such "inconsistency" or "color differences", visual inspection serves as an important check in the production line. Therefore, the control of various process parameters, especially the focal plane, is posed with highly demanding requirements.

Referring to FIG. 1, a conventional illumination system employs a light-homogenizing design based on a quadrilateral light-homogenizing rod 10. FIG. 2 shows conventional quadrilateral masks 20 which can be put together into a whole. However, the illumination system and the masks are primarily used for laser annealing, and cannot be used for the fabrication of LED devices.

The existing photolithographic tools for the exposure of patterned sapphire substrates are associated with a low yield, poor adaptability and unsuitability for mass production due to lens design cost, control system design and other reasons.

SUMMARY OF THE INVENTION

It is an objective of the present invention to provide an exposure apparatus capable of creating a field of exposure that is less affected by objective field of view (FoV) distortion and allows a higher useful depth of focus (UDoF) when compared to other fields of exposure of the same size and of creating a greater field of exposure with the same projection objective DoF.

To this end, the subject matter of the present invention lies in an exposure apparatus, including an exposure unit for exposing a wafer, the exposure unit including an illumination system and masks, the illumination system including a light-homogenizing unit, wherein the light-homogenizing unit includes a light-homogenizing quartz rod having a cross section of a regular hexagonal shape.

Additionally, in the exposure apparatus according to the present invention, each of the masks may have a regular hexagonal shape matching with the cross section of the light-homogenizing quartz rod.

Additionally, the exposure apparatus according to the present invention may further include a flood exposure unit for performing flood exposure on the exposed wafer.

Additionally, in the exposure apparatus according to the present invention, the flood exposure unit may include: a work piece support for carrying the exposed wafer; a flood exposure source for providing energy for the flood exposure; and a flood exposure control unit for controlling activation or deactivation of the flood exposure source and for controlling a duration of the activation or deactivation of the flood exposure source.

Additionally, in the exposure apparatus according to the present invention, the flood exposure source may be hermetically arranged under the work piece support to prevent external light from penetrating into the flood exposure unit.

Additionally, in the exposure apparatus according to the present invention, the work piece support may be downward compatible with 4-inch, 8-inch, 10-inch, 16-inch and larger wafers.

Additionally, the exposure apparatus according to the present invention may further include: a wafer cassette unit for storing wafers; a pick-up unit for picking up a wafer; and a pre-alignment unit for aligning the picked wafer, wherein the exposure unit exposes the aligned wafer by means of the light-homogenizing quartz rod having the cross section of the regular hexagonal shape and the masks.

Additionally, in the exposure apparatus according to the present invention, the pick-up unit may be a rotary manipulator.

Additionally, in the exposure apparatus according to the present invention, the wafer may be a sapphire substrate, or a silicon substrate, or a silicon germanium substrate.

Additionally, in the exposure apparatus according to the present invention, the illumination system may further include, arranged sequentially, a light source, a light collection unit and a relay unit, wherein the light-homogenizing unit is arranged between the light collection unit and the relay unit.

Additionally, in the exposure apparatus according to the present invention, the illumination system may further include a movable blade that is arranged between the light-homogenizing unit and the relay unit and is configured to activate or deactivate the light source and to scale a field of illumination of the light source via the light collection unit.

In order to solve the above described problems, the present invention also provides an exposure method for exposing a wafer, including the steps of: providing an illumination system including a light-homogenizing unit, the light-homogenizing unit including a light-homogenizing quartz rod having a cross section of a regular hexagonal shape; providing masks each having a regular hexagonal shape matching with the cross section of the light-homogenizing quartz rod; and exposing the wafer by using the exposure unit to form exposed patterns.

Additionally, the exposure method according to the present invention may further include, after the exposure step, a flood exposure step in which the exposed patterns are subjected to flood exposure to form flood-exposed patterns, wherein flood-exposed patterns have regular cylindrical shapes.

Additionally, the exposure method according to the present invention may further include, prior to exposing the wafer, the steps of: picking up the wafer; and pre-aligning the wafer.

Additionally, in the exposure method according to the present invention, the exposure of the wafer may include: repeatedly and consecutively measuring surface profile of the wafer; and exposing the wafer in one pass.

Additionally, in the exposure method according to the present invention, the measurement step may include: repeatedly and consecutively measuring the surface profile of the wafer by using a vertical measuring device; matching positional data of a wafer stage with measurement results from the vertical measuring device; and fitting and calculating a tilt of each field of view with respect to an optimum focal plane.

Additionally, in the exposure method according to the present invention, the exposure step may include: exposing the wafer in one pass in a stepped manner with the optimum focal plane of the wafer under a control of a vertical sensor of the wafer stage.

Compared with the prior art, in the exposure apparatus and method according to the present invention, the light-homogenizing quartz rod in the light-homogenizing unit of the illumination system has a regular hexagonal cross section rather than a quadrilateral cross section, and the masks are designed as regular hexagons each matches with the cross section of the light-homogenizing quartz rod. As a result, a hexagonal field of exposure created by the cross-sectionally hexagonal light-homogenizing quartz rod has a shorter diagonal than a quadrilateral field of exposure of the same size, thereby reducing the impact of the projection objective over DoF and hence allowing a greater UDoF of the projection objective. Additionally, with the same DoF of the projection objective, a hexagonal field of exposure created by the cross-sectionally hexagonal light-homogenizing quartz rod leads to an increase in area of exposure. As the present invention allows an increased UFoV of a projection objective, it can overcome the disadvantage that defocus arising from errors occurring in focal plane control carried out by the photolithographic system may lead to a degree of inhomogeneity of a pattern image on the substrate beyond a tolerable range and can eliminate "inconsistency" or "color differences" perceivable by the naked eye. According to the present invention, the shape correspondence between the cross sections of the light-homogenizing quartz rod and the masks, as well as the design of the hexagonal masks that are put together into a whole, is particularly suitable for the imaging of dense holes or circular pillars during the fabrication of LED devices or the like. According to the present invention, the addition of the flood exposure unit and step enhance the steepness of side faces of patterns formed from the exposure process so that the patterns are more regularized in shape, which is conducive to the yield. In the exposure method according to the present invention, a tilt of each FoV with respect to an optimum focal plane can be fitted and calculated based on repeated consecutive measurements of the wafer's surface profile, followed by exposure of the wafer in one pass. Compared to the conventional approaches that involve multiple measure and exposure cycles, the sensitivity to work pieces (i.e., wafers) is reduced, and the adaptability to substrates with high hardness (e.g., sapphire substrates) or great warpage is improved. According to the present invention, exposure of the wafer in one pass entails the advantages of shorter exposure time and lower manufacturing cost.

Figure 1:
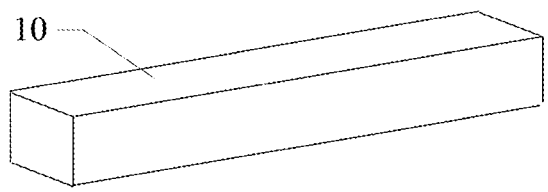
FIG. 1 is a structural schematic of a conventional light-homogenizing rod.
Figure 2:
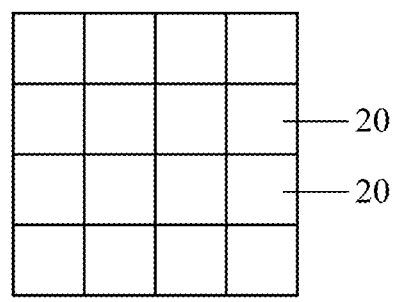
FIG. 2 is a structural schematic of conventional masks that are put together into a whole.
Figure 3:
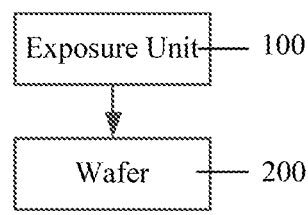
FIG. 3 is a structural schematic of an exposure apparatus according to the present invention.
Figure 4:
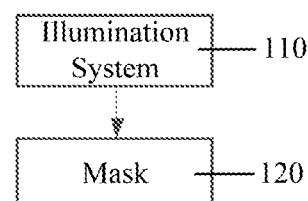
FIG. 4 is a structural schematic of an exposure unit according to the present invention.

In the figures relating to the prior art: 10—light-homogenizing rod; and 20—mask.

In the figures illustrating the present invention: 100—exposure unit; 110—illumination system; 111—light source; 112—light collection unit; 113—light-homogenizing unit; 1131—light-homogenizing quartz rod; 114—relay unit; 115—movable blade; 120—mask; 200—wafer; 201—pattern resulting from exposure; 202—pattern resulting from flood exposure; 300—flood exposure unit; 301—work piece support; 302—flood exposure source; 303—flood exposure control unit; 304—pick-up unit; 305—wafer cassette unit; 306—pre-alignment unit; 401—objective FoV; 402—regular hexagonal field of exposure; and 403—quadrilateral field of exposure.

DETAILED DESCRIPTION

The present invention will be described in detail with reference to the accompanying drawings.

Embodiment 1

FIGS. 3 to 6 show an exposure apparatus according to a first embodiment of the present invention, including an exposure unit 100 for exposing a wafer 200. The exposure unit 100 includes an illumination system 110 and masks 120.

The illumination system 110 includes a light-homogenizing unit 113. The light-homogenizing unit 113 includes a light-homogenizing quartz rod 1131 having a regular hexagonal cross section. Each mask 120 also has a regular hexagonal cross section which matches with the cross section of the light-homogenizing quartz rod 1131.

Figure 5:
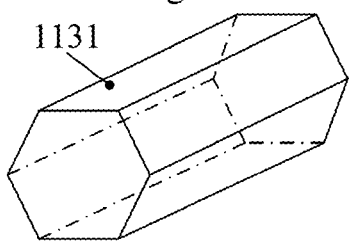
FIG. 5 is a structural schematic of a light-homogenizing quartz rod according to the present invention.
Figure 6:
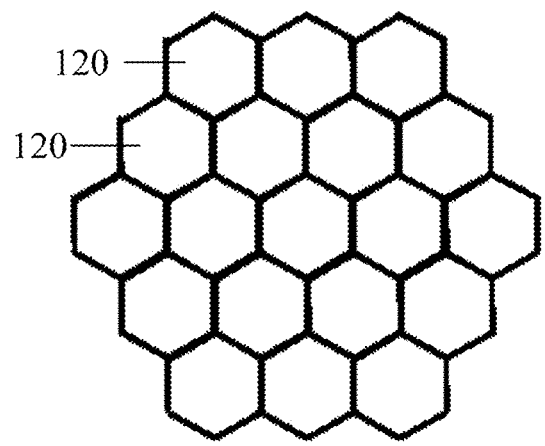
FIG. 6 is a structural schematic of masks that are put together into a whole in accordance with the present invention.
Figure 7:
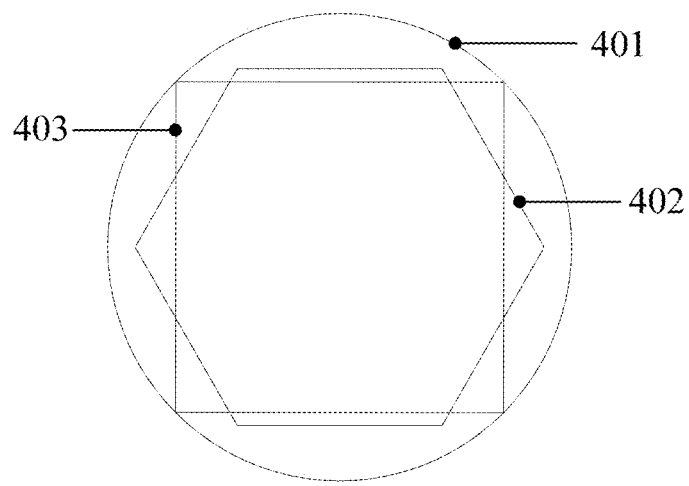
FIGS. 7 and 8 each show a relationship between a field of view (FoV) of an objective and fields of exposure.
Figure 8:
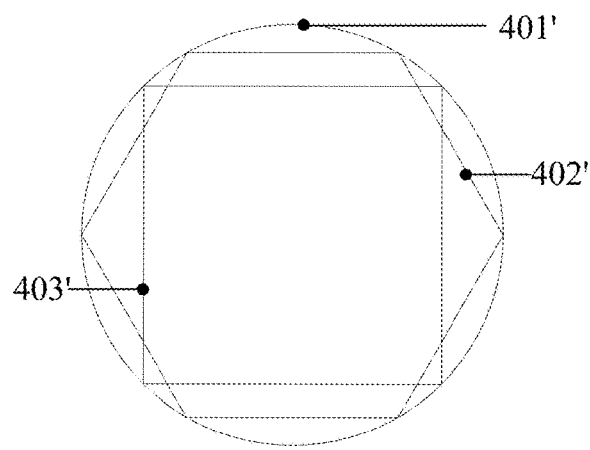

Specifically, as shown in FIG. 5, the light-homogenizing quartz rod 1131 in the light-homogenizing unit 113 of the illumination system 110 of the exposure apparatus according to the present invention has a regular hexagonal cross section rather than a quadrilateral cross section. Additionally, as shown in FIG. 6, in the exposure apparatus according to the present invention, each of the masks 120 is designed as a regular hexagon which matches with the cross section of the light-homogenizing quartz rod 1131, and the masks 120 can be put together by hexagonal stitching. FIGS. 7 and 8 each show a relationship between a field of view (FoV) of an objective and fields of exposure. With reference to FIG. 7 where 401 denotes the objective's FoV, a hexagonal field of exposure 402 created by the cross-sectionally hexagonal light-homogenizing quartz rod 1131 has a shorter diagonal than a quadrilateral field of exposure 40 of the same size, thereby reducing the impact of the projection objective over depth of focus (DoF) and hence allowing a greater useful DoF (UDoF) of the projection objective. With reference to FIG. 8 where 401' denotes the objective's FoV, with the same DoF of the projection objective, a hexagonal field of exposure 402' created by the cross-sectionally hexagonal light-homogenizing quartz rod 1131 is greater than a field of exposure 403' created by a cross-sectionally quadrilateral light-homogenizing quartz rod, thereby leading to an increase in area of exposure. As the present invention allows an increased UFoV of a projection objective, it can overcome the disadvantage that defocus arising from errors occurring in focal plane control carried out by the photolithographic system may lead to a degree of inhomogeneity of a pattern image on the substrate beyond a tolerable range and can eliminate "inconsistency" or "color differences" perceivable by the naked eye. According to the present invention, the shape correspondence between the cross sections of the light-homogenizing quartz rod 1131 and the masks 120, as well as the design of the hexagonal masks 120 that are put together into a whole by hexagonal stitching, is particularly suitable for the imaging of dense holes or circular pillars during the fabrication of LED devices or the like.

The wafer 200 may be a sapphire substrate, a silicon substrate, a silicon germanium (SiGe) substrate or the like.

Figure 9:
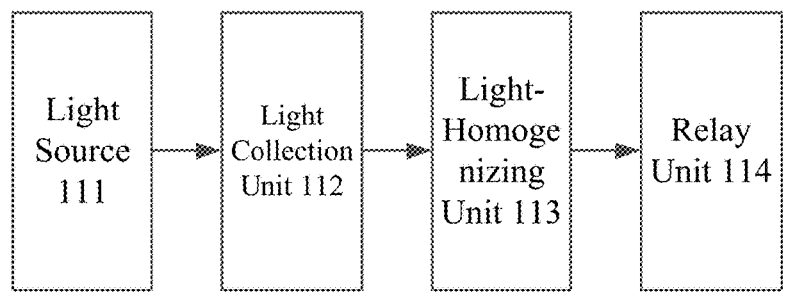
FIGS. 9 and 10 are structural schematics of an illumination system according to the present invention.

Referring to FIG. 9, the illumination system 110 further includes, disposed sequentially, a light source 111, implemented as a mercury lamp or LED, a light collection unit 112 and a relay unit 114, and the light-homogenizing unit 113 is arranged between the light collection unit 112 and the relay unit 114.

Figure 10:
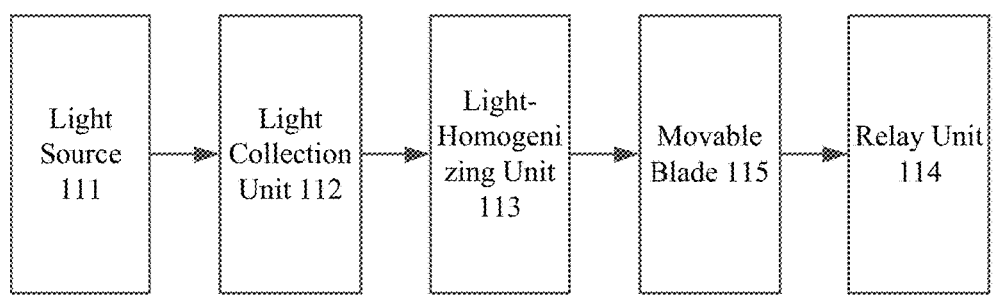

Referring to FIG. 10, the exposure apparatus according to the present invention may further include a movable blade 115 that is positioned between the light-homogenizing unit 113 and the relay unit 114 and is configured to activate or deactivate the light source 111 and to scale a field of illumination of light source 111 via the light collection unit 112. In other words, according to the present invention, fields of exposure of various sizes suited for the exposure of wafers 200 of various sizes can be created from the combination of the movable blade 115 and the masks 120 of various sizes.

Figure 11:
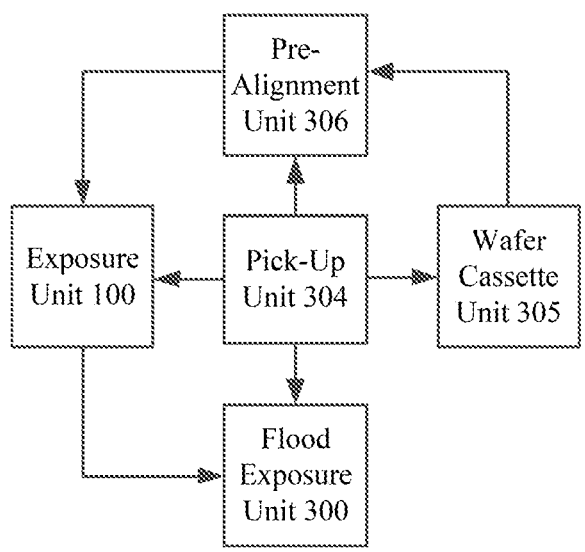
FIG. 11 is a structural schematic of a wafer transfer system.

Referring to FIG. 11, the exposure apparatus according to the present invention may further include: a wafer cassette unit 305 for storing the wafer 200; a pick-up unit 304 for picking up the wafer 200; and a pre-alignment unit 306 for aligning the picked wafer 200. The aligned wafer 200 is exposed by the exposure unit 100 with the aid of the cross-sectionally hexagonal light-homogenizing quartz rod 1131 and the masks 120. According to the present invention, the pre-alignment unit 306 may be either separate from or integral with the exposure unit 100. The pick-up unit 304 and the pre-alignment exposure unit 100, along with a flood exposure unit 300, may constitute a wafer transfer system for transporting the wafer 200 both prior and subsequent to its exposure and flood exposure. The pick-up unit 304 can work with each of the wafer cassette unit 305, the pre-alignment unit 306 and the exposure unit 100 for picking up the wafer 200. The pick-up unit 304 can be implemented as, for example, a rotary manipulator capable of transferring the wafer 200 from the wafer cassette unit 305 to the pre-alignment unit 306, from the pre-alignment unit 306 to the exposure unit 100 and from the exposure unit 100 back to the wafer cassette unit 305.

Figure 12:
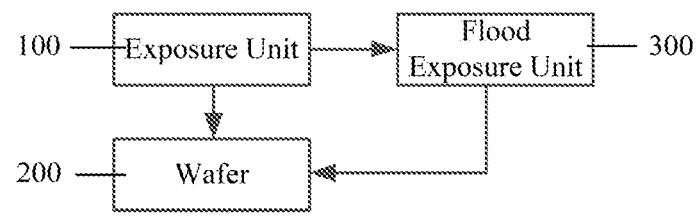
FIG. 12 is a structural schematic of an exposure apparatus according to the present invention, which additionally incorporates a flood exposure unit.
Figure 13:
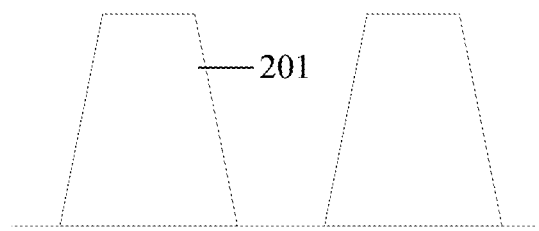
FIG. 13 shows the results of conventional exposure not involving flood exposure.
Figure 14:
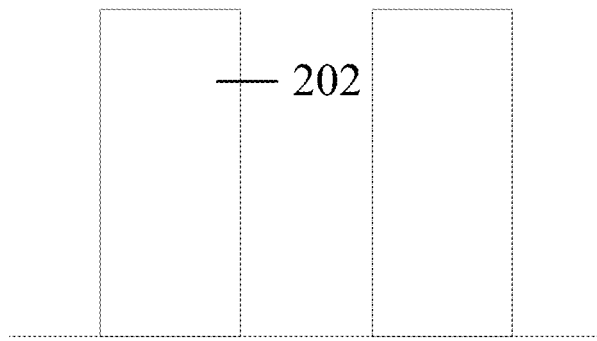
FIG. 14 shows the results from the addition of flood exposure.

Referring to FIG. 12, the exposure apparatus according to the present invention may further include the flood exposure unit 300 for carrying out flood exposure on the exposed wafer 200. By additionally including the flood exposure unit 300, the wafer transfer system is constituted by the pick-up unit 304, the wafer cassette unit 305, the pre-alignment unit 306, the exposure unit 100 and the flood exposure unit 300. According to the present invention, the addition of the flood exposure unit 300 can enhance the steepness of side faces of patterns formed during the exposure process so that the flood-exposed patterns are more regularized, which is conducive to the yield. FIG. 13 shows patterns formed conventionally without flood exposure. As shown in the figure, the patterns 201 have sloped side faces. While each pattern 201 is illustrated as a regular truncated cone with an unwanted portion delimited by the annular portion of the bottom end face extending beyond the top end face with respect to the heightwise direction and by the slant side face, in practice, the patterns 201 may also be irregular truncated cones. FIG. 14 shows results after flood exposure is introduced. The patterns 202 are illustrated as resulting from performing the flood exposure on the patterns 201. As shown in the figure, the unwanted portions of the patterns 201 are eliminated and the patterns 202 are or close to regularly shaped pillars. Therefore, according to the present invention, the yield can be improved by additionally including the flood exposure unit.

Figure 15:
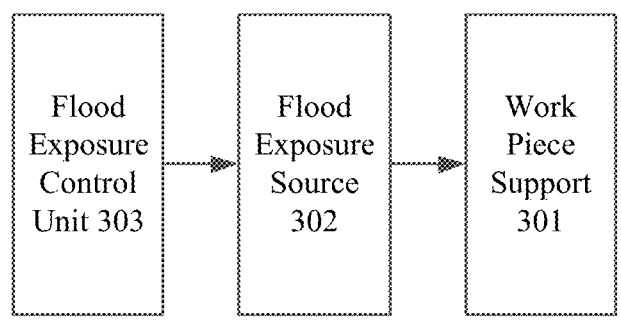
FIG. 15 is a structural schematic of a flood exposure unit according to the present invention.

Referring to FIG. 15, the flood exposure unit 300 may include: a work piece support 301 for supporting the exposed wafer 200; a flood exposure source 302 for providing energy for flood exposure; and a flood exposure control unit 303 for controlling the activation or deactivation of the flood exposure source 302 and for controlling a duration of the activation or deactivation of the flood exposure source 302.

Figure 16:
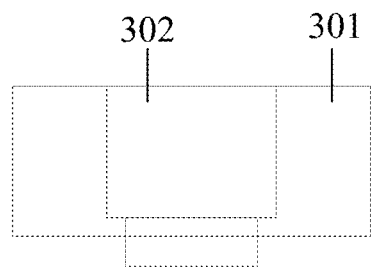
FIG. 16 schematically illustrates a relationship between a work piece support and a flood exposure source according to the present invention.

Referring to FIG. 16, the flood exposure source 302 may be hermetically disposed under the work piece support 301 to prevent external light from penetrating into the flood exposure unit 300. This can advantageously avoid external stray light from interfering with flood exposure of the wafer 200 by passing through the work piece support 301 and reaching the wafer 200 on the flood exposure unit 300, thus ensuring an increased yield.

In a preferred embodiment, the work piece support 301 is downward compatible with wafers 200 of all sizes. This advantageously allows it to be highly compatible and to be adapted to wafers 200 of all sizes, including 4-inch, 8-inch, 10-inch, 16-inch.

Embodiment 2

An exposure method according to a second embodiment for use with the exposure apparatus of Embodiment 1 includes at least the steps of: so designing the light-homogenizing quartz rod in the light-homogenizing unit of the illumination system that it has a regular hexagonal cross section; and so designing the masks that each of them has a shape matching with the cross section of the light-homogenizing quartz rod. A hexagonal field of exposure created by the cross-sectionally hexagonal light-homogenizing quartz rod has a shorter diagonal than a quadrilateral field of exposure of the same size, thereby reducing the impact of the projection objective over DoF and hence allowing a greater UDoF of the projection objective. Additionally, with the same DoF of the projection objective, a hexagonal field of exposure created by the cross-sectionally hexagonal light-homogenizing quartz rod is greater than a field of exposure created by a cross-sectionally quadrilateral light-homogenizing quartz rod, thereby leading to an increase in area of exposure.

In a preferred embodiment of the exposure method according to the present invention, after the wafer is exposed, it further experiences flood exposure in order to enhance the steepness of side faces of patterns resulting from the exposure so that the patterns are shaped into regular pillars, which is conducive to the yield. In connection with the description of the flood exposure unit of Embodiment 1, it can be seen that the addition of the flood exposure step can result in an improvement in the yield and can facilitate subsequent steps.

Specifically, the exposure method according to the present invention includes the steps of: picking up the wafer; pre-aligning the wafer; exposing the aligned wafer by means of the cross-sectionally hexagonal light-homogenizing quartz rod and the masks; and subjecting the exposed wafer to flood exposure. These steps can be streamlined in order to simplify the fabrication and facilitate management.

In a preferred embodiment of the exposure method according to the present invention, the exposure step includes: repeatedly and consecutively measuring surface profile of the wafer and exposing the wafer in one pass. The measurement may include: repeatedly and consecutively measuring surface profile of the wafer with a vertical measuring device; matching positional data of the wafer stage with the measurement results from the vertical measuring device; and fitting and calculating the tilt of each FoV with respect to an optimum focal plane. This offers the advantage that the measurement can be conducted repeatedly and consecutively without the need for further measurements subsequent to the exposure when compared to the conventional approach, which allows time savings. In particular, the exposure can be accomplished in a stepped manner in one pass concurrently with the wafer's optimum focal plane being under the control of a vertical sensor of the wafer stage. This offers the advantage that exposing the wafer in one pass allows higher exposure accuracy, time savings, cost reductions and higher product quality.

In conventional exposure approaches, control of the wafer stage is based only on the vertical measuring device which typically responds slowly and is hence not efficient. Moreover, the control is based on a limited number of representative points for leveling of the whole wafer surface, which imposes high requirements on the conditions of the wafer surface, in particular edge portions thereof. Thus, once unfavorable conditions of the work piece support leads to a relatively small DoF, field-to-field inconsistency will occur which is detrimental to the yield.

These drawbacks of the conventional exposure approaches can be overcome by the exposure method according to the present invention. A specific embodiment is set forth below to explain the method and its benefits, in which a silicon wafer is exposed as an example.

In step S1, the wafer is transferred onto the wafer stage.

In step S2, the wafer stage is globally aligned.

Figure 17:
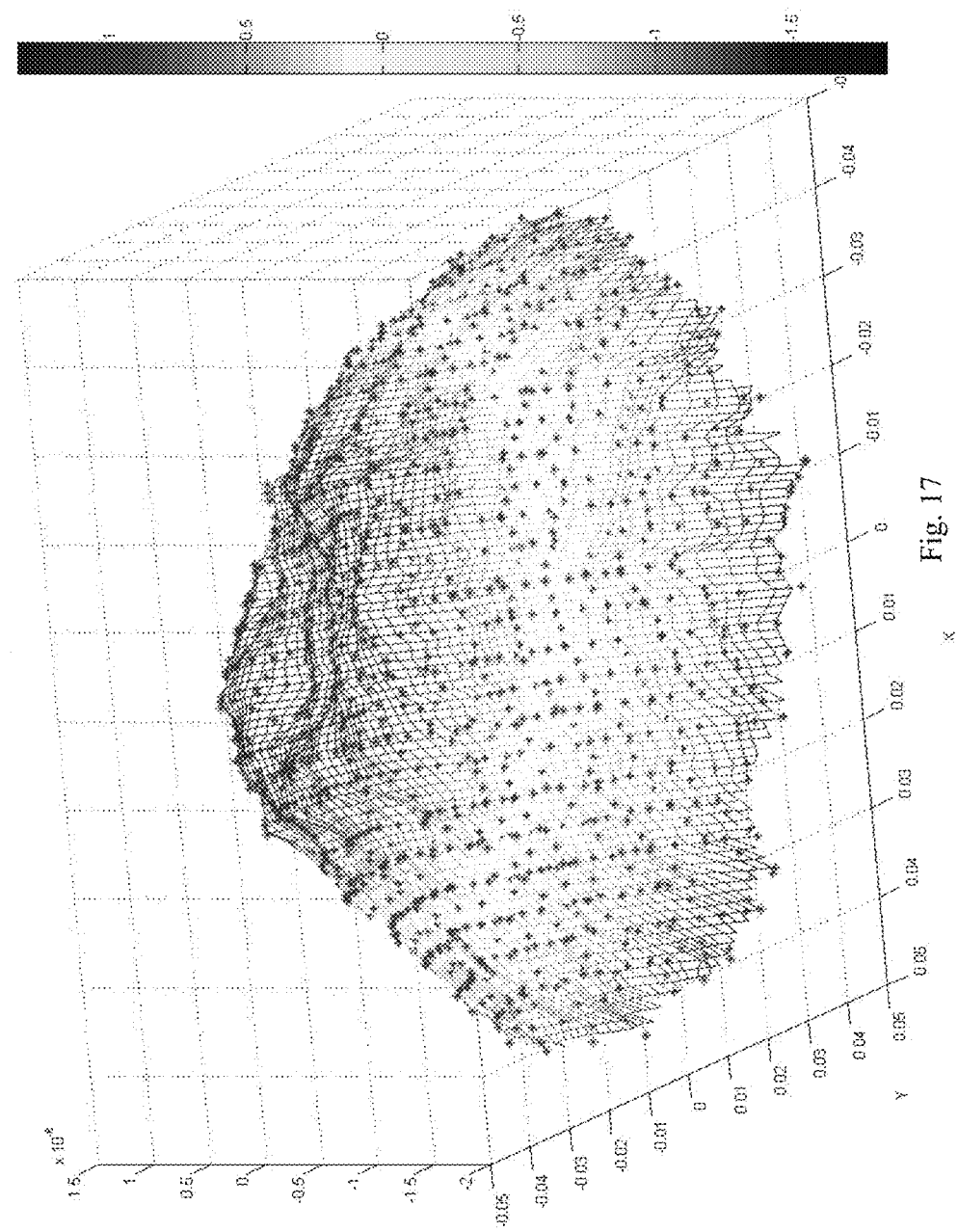
FIG. 17 schematically illustrates matching positional data of a wafer stage with measurement results from a vertical measuring device.
Figure 18:
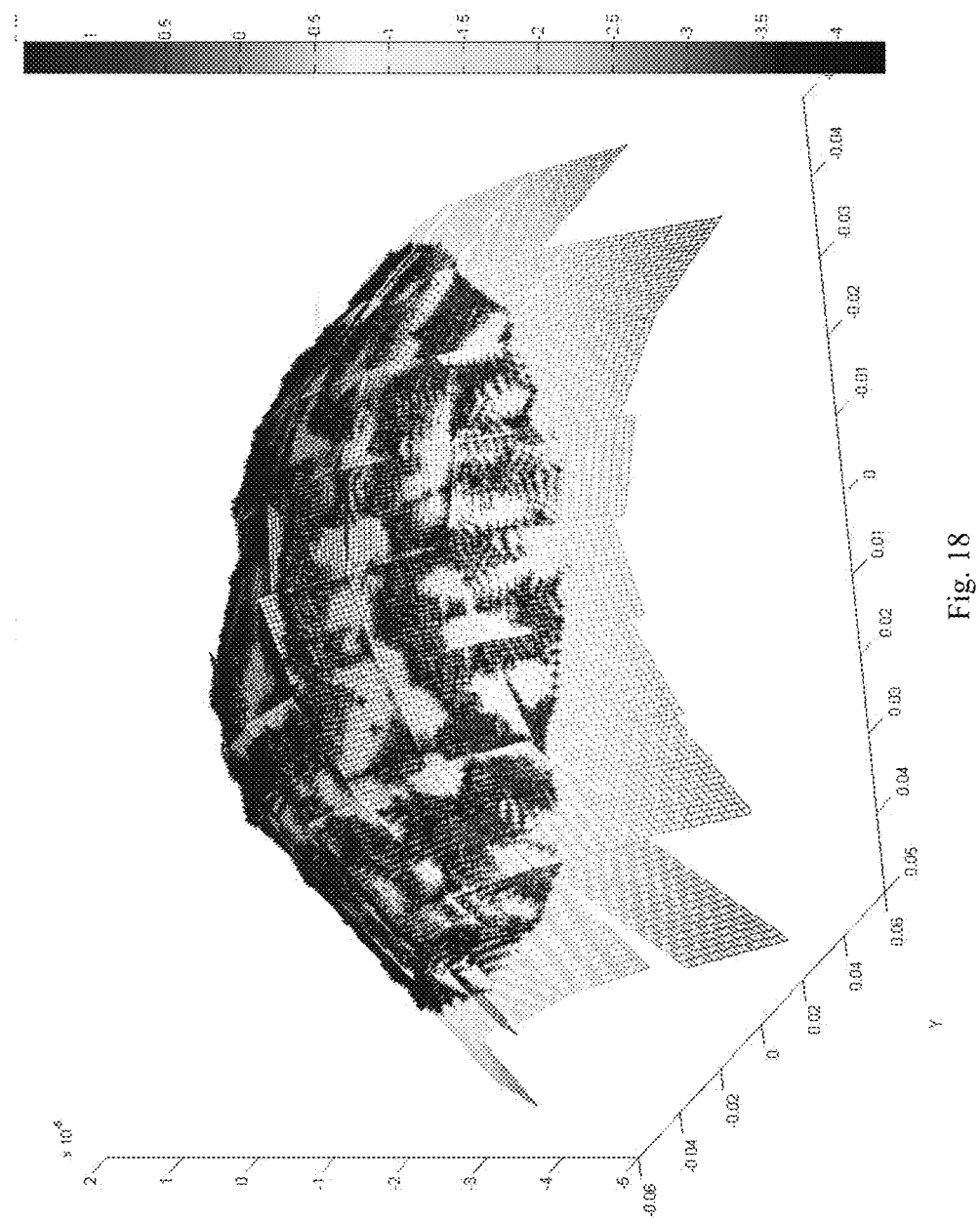
FIG. 18 schematically illustrates fitting and calculating a tilt of each FoV with respect to an optimum focal plane.

In step S3, the vertical sensor of the wafer stage, such as a grating scale, scans the whole FoV forth and back at a high speed, with the vertical position of the wafer stage being maintained, and wafer stage records positional data in real time and transfers the positional data to a host;

In step S4, the vertical measuring device carries out measurements consecutively during the scanning by the wafer stage, records the measurement results and transfers the measurement results to the host;

In step S5, the host compares the positional data of the wafer stage and the measurement results from the vertical measuring device, as shown in FIG. 17, and fits and calculates the tilt of each FoV with respect to an optimum focal plane, as shown in FIG. 18;

In step S6, the wafer is tuned to the optimum focal plane under the control of the vertical sensor of the wafer stage and exposure is carried out in a stepped manner;

In step S7, the exposed wafer is transferred to the flood exposure unit;

In step S8, flood exposure is performed.

In step S9, the wafer is taken out from the flood exposure unit.

With the exposure method according to the present invention, accurate positioning of optimum focal plane is enabled based on repeated consecutive measurements while taking into account wafer surface conditions. As such, homogeneous exposure can be achieved, resulting in an increased yield. Although the scanning and measurement takes a certain period of time, the overall time consumption is still advantageous over the conventional exposure approaches. According to the present invention, as the vertical measuring device does not participate in control in a direct way, the wafer stage can be compensated for in a high speed both horizontally and vertically, which is favorable to wafers with high hardness or great warpage.

In the exposure method according to the present invention, the tilt of each FoV with respect to the optimum focal plane can be fitted and calculated based on repeated consecutive measurements of the wafer's surface profile, followed by exposure of the wafer in one pass. Compared to the conventional approaches involving multiple measure and exposure cycles, the sensitivity to work pieces (i.e., wafers) is reduced, and the adaptability to substrates with high hardness (e.g., sapphire substrates) or great warpage. According to the present invention, exposure of the wafer in one pass entails the advantages of shorter exposure time and lower manufacturing cost.

In these embodiments, the terms "hexagonal" refers to the regular hexagonal shape, and "quadrilateral" to the regular quadrilateral shape, i.e., square.

The present invention is not limited to the above specific embodiments, and the exposure apparatus and method according to the present invention are equivalently suited to use in integrated photoelectric systems, guidance and detection patterns for magnetic domain memories, flat panel displays, liquid crystal displays, thin film magnetic heads and other fields. Any and all changes made within the spirit and scope of the appended claims fall within the scope of the present invention.

What is claimed is:

1. An exposure apparatus, comprising an exposure unit for exposing a wafer, the exposure unit comprising an illumination system and masks, the illumination system comprising a light-homogenizing unit, wherein the light-homogenizing unit comprises a light-homogenizing quartz rod having a cross section of a regular hexagonal shape, wherein each of the masks has a regular hexagonal shape matching with the cross section of the light-homogenizing quartz rod, the exposure apparatus further comprises a flood exposure unit for performing flood exposure on an exposed wafer, wherein the flood exposure unit comprises: a work piece support for carrying the exposed wafer; a flood exposure source for providing energy for the flood exposure; and a flood exposure control unit for controlling activation or deactivation of the flood exposure source and for controlling a duration of the activation or deactivation of the flood exposure source, wherein the flood exposure source is hermetically arranged under the work piece support to prevent external light from penetrating into the flood exposure unit.

2. The exposure apparatus of claim 1, wherein the work piece support is downward compatible with 4-inch, 8-inch, 10-inch, 16-inch and larger wafers.

3. The exposure apparatus of claim 1, further comprising:
a wafer cassette unit for storing wafers;
a pick-up unit for picking up a wafer; and
a pre-alignment unit for aligning the picked wafer,
wherein the exposure unit exposes the aligned wafer by means of the light-homogenizing quartz rod having the cross section of the regular hexagonal shape and the masks.

4. The exposure apparatus of claim 3, wherein the pick-up unit is a rotary manipulator.

5. The exposure apparatus of claim 1, wherein the wafer is a sapphire substrate, or a silicon substrate, or a silicon germanium substrate.

6. The exposure apparatus of claim 1, wherein the illumination system further comprises, arranged sequentially, a light source, a light collection unit and a relay unit, and wherein the light-homogenizing unit is arranged between the light collection unit and the relay unit.

7. The exposure apparatus of claim 6, wherein the illumination system further comprises a movable blade arranged between the light-homogenizing unit and the relay unit and is configured to activate or deactivate the light source and to scale a field of illumination of the light source via the light collection unit.

8. An exposure method for exposing a wafer, comprising the steps of:
providing an illumination system comprising a light-homogenizing unit, the light-homogenizing unit comprising a light-homogenizing quartz rod having a cross section of a regular hexagonal shape;
providing masks each having a regular hexagonal shape matching with the cross section of the light-homogenizing quartz rod; and
exposing the wafer by using the exposure unit to form exposed patterns,
wherein the method further comprises, after the exposure step: providing a flood exposure unit and conducting a flood exposure step by using the flood exposure unit, the flood exposure unit comprises a work piece support for carrying the exposed wafer; a flood exposure source for providing energy for the flood exposure; and a flood exposure control unit for controlling activation or deactivation of the flood exposure source and for controlling a duration of the activation or deactivation of the flood exposure source, wherein in the flood exposure step, the exposed patterns are subjected to flood exposure to form flood-exposed patterns, wherein flood-exposed patterns have regular cylindrical shapes,
wherein the flood exposure source is hermetically arranged under the work piece support to prevent external light from penetrating into the flood exposure unit.

9. The exposure method of claim 8, further comprising, prior to exposing the wafer, the steps of:
picking up the wafer; and
pre-aligning the wafer.

10. The exposure method of claim 8, wherein exposing the wafer comprises: repeatedly and consecutively measuring surface profile of the wafer; and exposing the wafer in one pass.

11. The exposure method of claim 10, wherein the measurement step comprises: repeatedly and consecutively measuring the surface profile of the wafer by using a vertical measuring device; matching positional data of a wafer stage with measurement results from the vertical measuring device; and fitting and calculating a tilt of each field of view with respect to an optimum focal plane.

12. The exposure method of claim 10, wherein the exposure step comprises: exposing the wafer in one pass in a stepped manner with the optimum focal plane of the wafer under a control of a vertical sensor of the wafer stage.

* * * * *